United States Patent [19]
Lohrmann

[11] 3,925,736
[45] Dec. 9, 1975

[54] DIODE QUAD MODULATOR WITH VERY HIGH DYNAMIC RANGE

[75] Inventor: Dieter R. Lohrmann, Eatontown, N.J.

[73] Assignee: The United States of America as represented by the Secretary of the Army, Washington, D.C.

[22] Filed: Sept. 6, 1974

[21] Appl. No.: 504,003

[52] U.S. Cl. .................. 332/43 B; 307/321; 332/47
[51] Int. Cl.² ....................... H03C 1/58; H03C 1/60
[58] Field of Search ........... 332/43 R, 43 B, 44, 45, 332/47; 307/321; 325/137, 138, 49, 50

[56] References Cited

UNITED STATES PATENTS

| | | | |
|---|---|---|---|
| 2,676,304 | 4/1954 | Ensink et al. | 332/45 |
| 2,842,744 | 7/1958 | Frank | 332/47 |

FOREIGN PATENTS OR APPLICATIONS

| | | | |
|---|---|---|---|
| 21,907 | 3/1935 | Australia | 332/47 |

*Primary Examiner*—Alfred L. Brody
*Attorney, Agent, or Firm*—Nathan Edelberg; Robert P. Gibson; Frank J. Dynda

[57] ABSTRACT

An improved diode quad modulator in which the diodes are arranged in split pairs to permit the use of a higher modulation signal input voltage for mixing with a carrier signal frequency, thus improving the dynamic range of the overall modulator circuit. The diodes are paired across each winding of a split transformer secondary and utilized with a double-ended RF generator providing independent back biasing, thereby allowing for an increased input signal source voltage capability approximately ten-fold of that found in the prior art.

2 Claims, 2 Drawing Figures

DIODE QUAD MODULATOR WITH VERY HIGH DYNAMIC RANGE

The invention described herein may be manufactured and used by or for the Government for governmental purposes without the payment of any royalties thereon or therefor.

BACKGROUND OF THE INVENTION

In a balanced modulator, normally used for mixing an RF and a carrier signal, the purpose of the modulator is to suppress the carrier frequency when mixing an RF input signal of a particular frequency and the carrier signal to obtain the sum and difference frequencies. As is known in the prior art, a quad modulator (sometimes known as a ring modulator) is an arrangement of diodes in a particular configuration which allows for the mixing of two frequencies and the suppression of the carrier frequency. A limitation of the diode quad modulator as shown in the prior art has been that the biasing voltage of the diodes has limited the signal source input voltage such that in a typical range with a 10 volt carrier frequency, the peak voltage of the input signal source was limited to a range of approximately 0.5 volts.

The present invention provides an improved diode quad modulator in which the signal source input voltage may be increased approximately ten-fold over that shown in the prior art, before the output amplitude departs from linearity.

This invention relates generally to a diode quad modulator circuit and specifically to an improved diode quad modulator circuit with an increased voltage dynamic operating range.

BRIEF DESCRIPTION OF THE INVENTION

An improved diode quad modulator comprising a double-ended carrier frequency oscillating means, an input transformer, an output transformer, said input transformer having a primary winding receiving an RF frequency input voltage, and a split secondary winding, each of said split secondary winding branches connected to a pair of diodes, such that when one pair is turned on, the second pair may be back biased independently with several volts and vice versa. The diode pairs are coupled to the output transformer primary. The double-ended oscillator is connected and center tapped to each branch of the input transformer secondary.

In operation an input RF signal is received in the input transformer primary and this signal frequency is mixed with the local oscillator (carrier) frequency. The local oscillator is double-ended and is grounded and the primary of the output transformer is center tap grounded. The local oscillator is center tapped across the split secondary of the input transformer in a series configuration. With the present invention, pairs of diodes are branched across the input transformer secondary windings such that the back biasing independently of each diode pair will permit the use of much higher RF input signal voltage, thus allowing for improved dynamic range of the mixer.

In a typical experiment with the present device, an input signal voltage of approximately 6 volts RMS coming from the signal source into the mixer was utilized while in the conventional quad modulator circuit shown in the prior art, the input voltage peak of 0.5 volts was the upper limit.

It is an object of this invention to provide an improved diode modulator circuit which allows an increased input voltage which thereby increses its range.

It is another object of this invention to provide a diode quad modulator having the diodes paired in such a way to allow increased signal input voltage resulting in improved output signal characteristics.

In accordance with these and other objects which will be apparent hereinafter, the instant invention will now be described with particular reference to the accompanying drawings.

PREFERRED EMBODIMENT OF THE INVENTION

Figure 1:
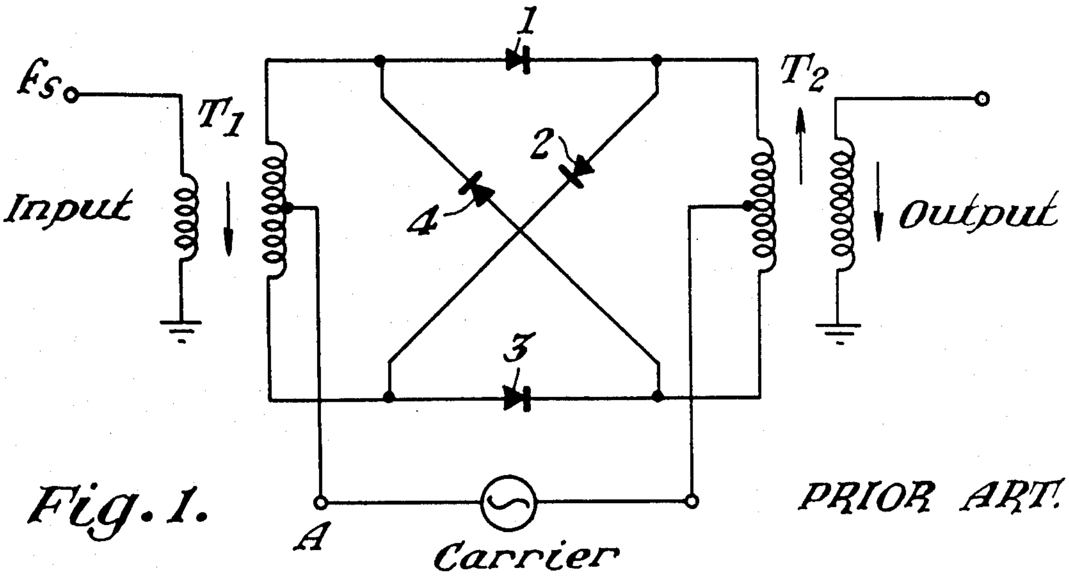
FIG. 1 shows a schematic diagram of a typical conventional diode quad modulator found in the prior art.

Referring now to the drawings and particularly FIG. 1, a conventional prior art circuit diagram is shown of a diode quad modulator which has an input transformer T1 which receives an audio frequency electro-magnetic signal $f_s$ across its primary with an arrangement of diodes connected across a secondary of the input transformer winding to provide for frequency mixing of the input RF signal and the carrier frequency shown connected across the center tap, the secondary of transformer T1 and across the primary of output transformer T2. With the diode configuration, diodes 1, 2, 3 and 4, shown in FIG. 1, the dynamic operating range of the quad mixer is limited by the forward voltage drop across the turned on pairs of diodes, because this voltage back biased the turned off pair simultaneously. This resulted in a limitation of the RF input signal voltage allowable such that the peak signal voltage would be in the neighborhood of 0.5 volts when utilized with a typical carrier frequency voltage of approximately 10 volts. Thus the maximum signal input voltage that can be processed "linearly" in an ordinary diode quad mixer in the prior art is typically 0.5V.

Figure 2:
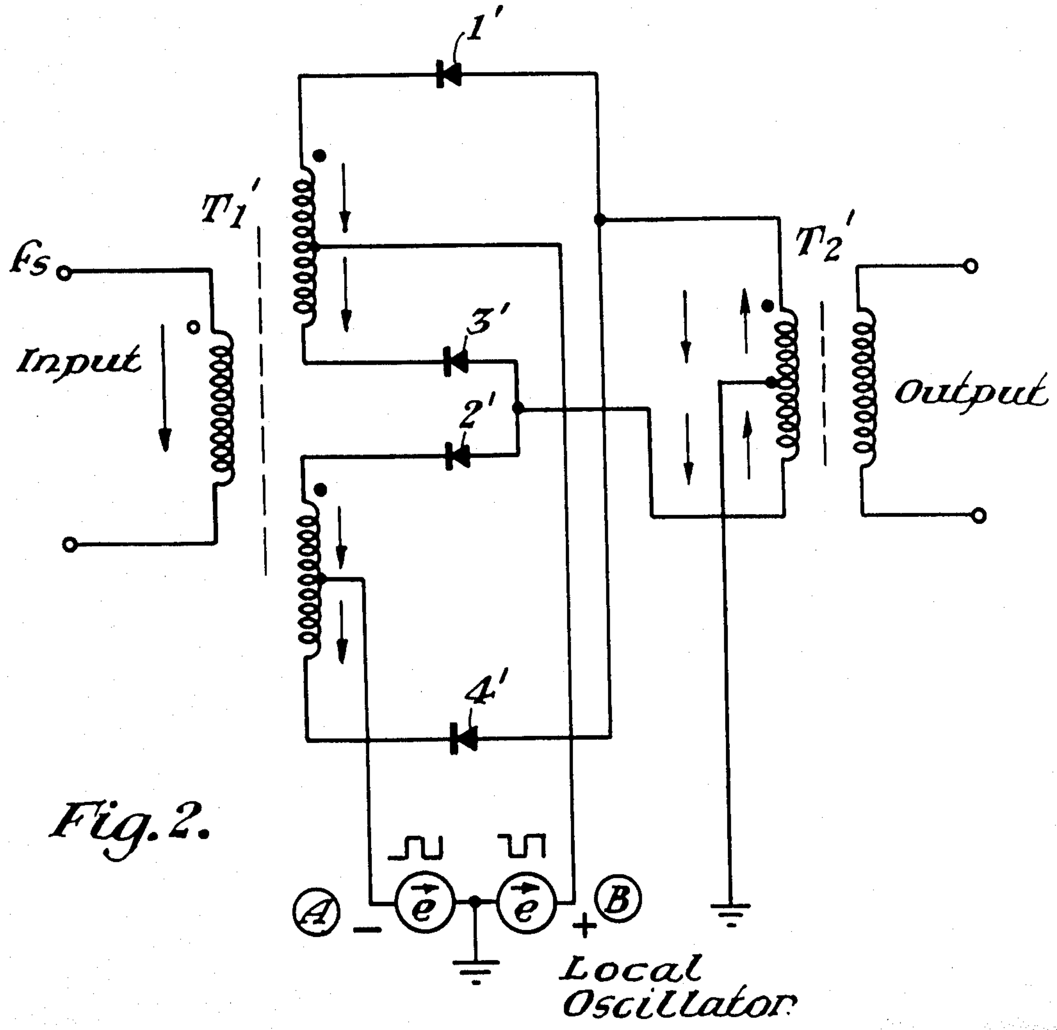
FIG. 2 shows a schematic diagram of the improved diode quad modulator circuit.

Referring now to the present invention shown in FIG. 2, Applicant has split the diode quad into two pairs which provides that while one pair is turned on, the second pair may be back biased independently with several volts and vice versa. As shown in FIG. 2, an input transformer T1' is connected to receive an RF input signal acorss its primary while the secondary windings across T1' are branched so that diodes 1' and 3' constitute and are coupled across one branch of the transformer secondary while diodes 2' and 4' constitute a second pair of diodes coupled across the second branch of the input transformer secondary. Each branch of the secondary transformer windings of the input transformer is center tapped and connected to a double-ended local oscillator.

The first pair of diodes 1' and 3' are connected across one branch of the input transformer T1' secondary winding with diode 1' connected to the primary output transformer T2'. Diode 3' is coupled in series with diode 2' which is connected across a second secondary branch of the input transformer T1' such that diodes 2' and 3' are connected across one end of the output transformer primary while diodes 1' and 4' are connected across the opposite end of the primary transformer T2′ winding. The primary winding of the output transformer T2′ is center tapped to ground.

Thus as shown in operation, the pair 1 of diodes 1′ and 3′ may be turned on while diodes 2′ and 4′ as a second pair may be back biased independently with several volts. In the present invention, the AF input signal voltage does not back bias the turned off diodes to limit input voltage as shown in the prior art.

The present invention may be utilized in such a device as a single sideband transmitter, high dynamic range receiver, spectrum analyzers, RF selective volt meters etc. or in any mixing circuit in which it is desirous to filter out the local oscillating frequency which results in a signal output consisting of frequencies of the sum and difference of the carrier and modulating signal while filtering out the original carrier frequency. The invention provides an overall higher input signal voltage which may be used resulting in improved output signal characteristics, resulting in an improved dynamic range of the mixer.

The instant invention has been shown and described herein in what is considered to be the most practical and preferred embodiment. It is recognized, however, that departures may be made therefrom within the scope of the invention and that obvious modifications will occur to a person skilled in the art.

What I claim is:

1. An improved diode quad modulator for mixing a modulating frequency with a carrier RF frequency to obtain an output signal frequency in which the carrier frequency is suppressed comprising:

an output transformer;

an input transformer, said input transformer having a primary input frequency signal receiving means; and a secondary winding, said secondary winding comprising a first branch and a second branch, the positive terminal of said first branch being connected to the negative terminal of said second branch through a pair of series back-to-back diodes, the center connection of said series back-to-back diodes being connected to one end of the primary winding of said output transformer; the negative terminal of said first branch being connected to the positive terminal of said second branch through another pair of similarly connected back-to-back diodes, the center connection of said other pair of series back-to-back diodes being connected to the other end of said primary winding of said output transformer;

a double-ended RF oscillator, said RF oscillator having a grounded connection between the ends of said double-ended RF oscillator, one end of said double-ended RF oscillator, being connected to a center tap on said first branch of said input transformer secondary winding, and the other end of said double-ended RF oscillator being connected to a center tap on said second branch of said input transformer secondary winding;

center tap to ground connected to the primary winding of the output transformer; and a secondary winding connected to the output transformer for producing an output signal.

2. An improved diode quad modulator as in claim 1 wherein one end of said double-ended RF oscillator provides forward biasing current to the conducting pair of diodes connected to said first branch of said input transformer secondary winding while the other end of said double-ended RF oscillator provides back biasing voltage to the non-conducting pair of diodes connected to said second branch of said input transformer secondary winding.

* * * * *